United States Patent
Aria et al.

(10) Patent No.: US 9,249,016 B2
(45) Date of Patent: Feb. 2, 2016

(54) GRAPHENE-BASED MULTI-JUNCTIONS FLEXIBLE SOLAR CELL

(75) Inventors: Adrianus I. Aria, Pasadena, CA (US); Morteza Gharib, Altadena, CA (US)

(73) Assignee: CALIFORNIA INSTITUTE OF TECHNOLOGY, Pasadena, CA (US)

(*) Notice: Subject to any disclaimer, the term of this patent is extended or adjusted under 35 U.S.C. 154(b) by 387 days.

(21) Appl. No.: 13/419,001

(22) Filed: Mar. 13, 2012

(65) Prior Publication Data

US 2012/0247545 A1 Oct. 4, 2012

Related U.S. Application Data

(60) Provisional application No. 61/468,970, filed on Mar. 29, 2011.

(51) Int. Cl.
| | |
|---|---|
| *H01L 31/042* | (2014.01) |
| *B82Y 30/00* | (2011.01) |
| *H01L 31/0687* | (2012.01) |
| *H01L 31/18* | (2006.01) |
| *H01L 31/043* | (2014.01) |

(52) U.S. Cl.
CPC .......... *B82Y 30/00* (2013.01); *H01L 31/043* (2014.12); *H01L 31/0687* (2013.01); *H01L 31/1804* (2013.01); *H01L 31/1896* (2013.01); *Y02E 10/544* (2013.01); *Y02E 10/547* (2013.01)

(58) Field of Classification Search
CPC ........... H01L 51/0045; H01L 51/0048; H01L 31/00–31/078; Y02E 10/50–10/60
USPC ................................................ 136/243–265
See application file for complete search history.

(56) References Cited

U.S. PATENT DOCUMENTS

| | | | | |
|---|---|---|---|---|
| 5,853,497 | A * | 12/1998 | Lillington et al. | 136/249 |
| 2004/0200523 | A1* | 10/2004 | King et al. | 136/262 |
| 2006/0076050 | A1* | 4/2006 | Williams et al. | 136/263 |
| 2006/0112986 | A1* | 6/2006 | Atwater et al. | 136/249 |
| 2007/0137698 | A1* | 6/2007 | Wanlass et al. | 136/261 |
| 2007/0235076 | A1* | 10/2007 | Liu et al. | 136/253 |
| 2008/0276987 | A1 | 11/2008 | Flood | |
| 2009/0071533 | A1 | 3/2009 | Choi et al. | |
| 2010/0006136 | A1 | 1/2010 | Zide | |
| 2010/0132773 | A1* | 6/2010 | Lagally et al. | 136/255 |
| 2010/0206362 | A1 | 8/2010 | Flood | |
| 2011/0030772 | A1* | 2/2011 | Veerasamy | 136/256 |
| 2011/0203632 | A1* | 8/2011 | Sen et al. | 136/244 |

FOREIGN PATENT DOCUMENTS

WO    WO 2008/132445 A2    11/2008

OTHER PUBLICATIONS

Lee, Dongyun, International Search Report and Written Opinion, PCT/US2012/028909, Oct. 15, 2012, Korean Intellectual Property Office.
Bai, Lingfei, International Preliminary Report on Patentability and Written Opinion, PCT/US2012/028909, Oct. 1, 2013, The International Bureau of WIPO.

(Continued)

*Primary Examiner* — Bach Dinh
(74) *Attorney, Agent, or Firm* — One LLP

(57) ABSTRACT

This disclosure relates to structures for the conversion of light into energy. More specifically, the disclosure describes devices for conversion of light to electricity using photovoltaic cells comprising graphene.

16 Claims, 4 Drawing Sheets

(56) References Cited

OTHER PUBLICATIONS

Bae, S., et al., "Roll-to-roll production of 30-inch graphene films for transparent electrodes", Nat Nano, 2010, vol. 5, No. 8, pp. 574-578.
Caldwell, J. D., et al., "Technique for the Dry Transfer of Epitaxial Graphene onto Arbitrary Substrates", ACS Nano, 2010, vol. 4, No. 2. pp. 1108-1114.
Li, X., et al., "Large-Area Synthesis of High-Quality and Uniform Graphene Films on Copper Foils", Science, 2009, vol. 324, pp. 1312-1314.
Reina, A., et al., "Large Area, Few-Layer Graphene Films on Arbitrary Substrates by Chemical Vapor Deposition", Nano Letters, 2009, vol. 9, No. 1, pp. 30-35.
Aria, Adrianus I., et al., "Band Gap Opening of Graphene after UV/Ozone and Oxygen Plasma Treatments", MRS Proceedings, vol. 1284, Jan. 2011, pp. 117-122.
De Arco, Lewis Gomez, et al., "Continuous, Highly Flexible, and Transparent Graphene Films by Chemical Vapor Deposition of Organic Photovoltaics", 2010, vol. 4, No. 5, pp. 2865-2873.
EP, 12763019 Supplementary European Search Report, Mar. 17, 2015.

\* cited by examiner

GRAPHENE-BASED MULTI-JUNCTIONS FLEXIBLE SOLAR CELL

CROSS REFERENCE TO RELATED APPLICATIONS

This application claims priority under 35 U.S.C. §119 from Provisional Application Ser. No. 61/468,970, filed Mar. 29, 2011, the disclosure of which is incorporated herein by reference.

TECHNICAL FIELD

This disclosure relates to structures for the conversion of light into energy. More specifically, the disclosure describes devices for conversion of light to electricity using graphene-based solar cells.

BACKGROUND

In recent years, numerous alternatives to coal, oil, and natural gas for generating electrical energy have been proposed. Among these alternative sources of energy, the conversion of solar energy to electric energy using photovoltaic solar cells is considered the most promising. However, the current photovoltaic technology comprises limitations that make it difficult to compete with the fossil-fuel technology. In addition to the high costs of semiconductor materials, fabrication and handling, the maximum efficiency of energy conversion that can be achieved by the current photovoltaic technology is about 25%.

SUMMARY

The disclosure provides a multijunction solar cell comprising a plurality of sub-cells, at least two sub-cells of the plurality of sub-cells having a different band gap energy, wherein at least one of the plurality of sub-cells comprises a n-type semiconductive graphene stacked on a p-type semiconductive graphene. In one embodiment, the plurality of sub-cells comprise more than 2 sub-cells. In another embodiment, the plurality of sub-cells comprises 3 or more sub-cells. In yet a further embodiment, the different band gap energy decreases in subsequent sub-cells more distal from incident light energy. In another embodiment, the solar cell comprises a plurality of sub-cells each having a difference of about 0.25 eV or more compared to an immediately adjacent sub-cell. In any of the foregoing embodiments, the solar cell comprises a plurality of sets of sub-cells, each set comprising plurality of monoatomic graphene p-n-layers and each monoatomic p-n-layer with in a set comprising similar band gaps and each different set of sub-cells comprising different band gaps. In one embodiment, the solar cells further comprises a transparent conductive substrate separating and in contact with each sub-cell. In a further embodiment the solar cell further comprises an anti-reflective coating and metal contact at the surface closest to the light source and a metal contact at the surface furthest from the light source, the contacts separated by the plurality of sub-cells. In one embodiment, the n-type graphene is doped with nitrogen or phosphorous. In another embodiment, the p-type graphene is doped with boron or aluminum.

The disclosure also provides a multijunction solar cell comprising a top metal contact and an antireflective coating; a first sub-cell comprising a first transparent conductive layer in contact with the top metal contact, a first n-type graphene layer in contact with the first transparent conductive layer, a first p-type graphene layer in contact with the first n-type graphene layer, wherein both the first n- and p-type graphene layers have the same band gap; a second sub-cell comprising a second transparent conductive layer in contact with a previous P-type graphene layer, a second n-type graphene layer in contact with the second transparent conductive layer, a second p-type graphene layer in contact with the second n-type graphene layer, wherein both the second n- and p-type graphene layers have the same band gap and wherein the second n- and p-type layers having a band gap that is the same or smaller than the first sub-cell; a bottom transparent conductive layer in contact with the second p-type graphene layer; and a bottom metal contact in electrical contact with the second P-type graphene layer. In a further embodiment, one or more addition sub-cells separate the first and second sub-cells.

The disclosure also provides a method of making a graphene multijunction solar cell comprising depositing a monoatomic graphene layer of either p-doped or n-doped graphene on a thin film of metal; placing a transparent conductive flexible substrate having a thin film of transparent conductive oxide onto the surface of the monoatomic graphene layer; removing the metal film the monoatomic graphene layer; oxidizing the monoatomic graphene layer to open up its band gap to provide a graphene-flexible substrate assembly; combining one or more other graphene-flexible substrate assemblies that have equal band gap but opposite doping to provide a p-n-doped graphene assembly; stacking one or more p-n-doped assembly or sub-cell on top or on bottom of other of p-n-doped assembly or sub-cell with the same or different band gaps. In one embodiment, the depositing is by chemical vapor deposition techniques. In another embodiment, the oxidizing is by UV/ozone treatment or oxygen plasma treatment.

There are several advantages offered by a graphene-based multi-junction solar cell of the disclosure that are not offered by the common III-V semiconductor material multi-junction solar cell. These advantages include, but are not limited to: semiconducting graphene has a direct band gap that makes it able to absorb more photons in a much thinner region compared to the indirect band gap materials such as silicon; and the electrons and holes carrier mobility of graphene is about two orders of magnitude higher than that of silicon and other semiconductor materials. Therefore, the internal resistance of the graphene-based solar cell will definitely be much less than that of the common semiconductor solar cell; unlike indium and tellurium that are available in the earth's crust in a very small quantity, carbon is abundant and the cost to fabricate high purity graphene is comparable to the fabrication cost of crystalline silicon.

The details of one or more embodiments of the invention are set forth in the accompanying drawings and the description below. Other features, objects, and advantages of the invention will be apparent from the description and drawings, and from the claims.

DETAILED DESCRIPTION

Figure 1A:
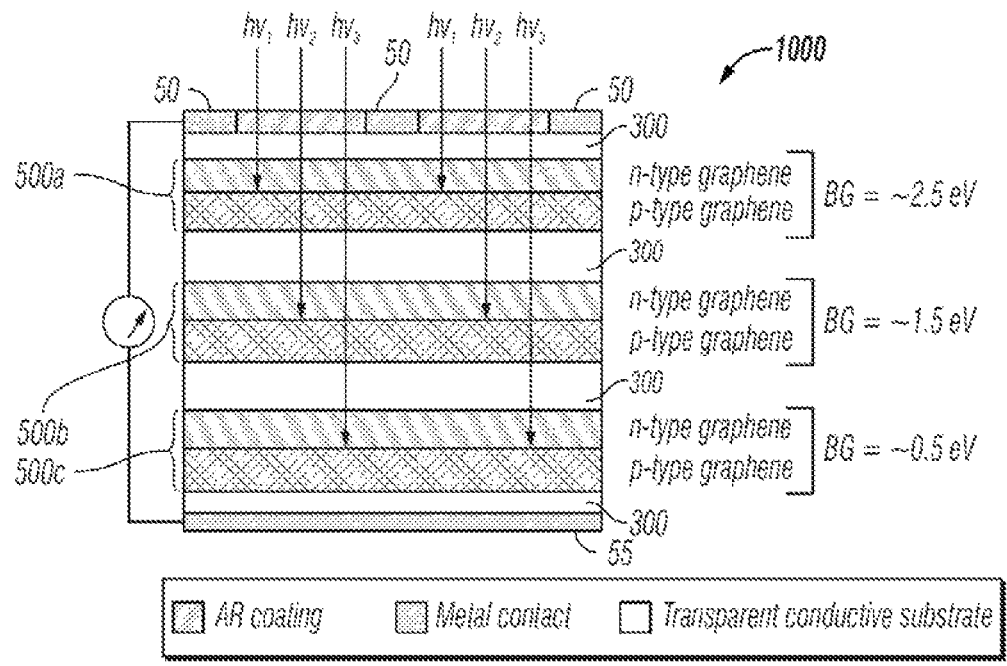
FIG. 1A-B shows a triple-junctions graphene solar cell made out of three components of semiconducting graphene with different band gaps that are stacked on top of each other and separated by transparent conductive, preferably flexible, substrates.

A solution to make photovoltaic technology more competitive is to reduce the production cost of solar cells by decreasing the thickness of each cell from hundreds of microns to less then a hundred (e.g., 50, 40, 30, 20, 10 or fewer) microns thick. Such thin-film solar cells will cost less than traditional solar cells because they use less semiconductor materials and less rare-earth element dopants. Furthermore, these thin-film solar cells can be deposited on cheap flexible substrates such as plastic or polymers such that the difficulties in handling and installation can be reduced significantly. The efficiency of thin-film solar cells can be increased by connecting multiple solar cells with different band gaps in series, known as multi-junctions solar cells. The maximum energy conversion of a multi-junctions solar cell is significantly higher than that of a traditional one because of its ability to convert broad range of photon energies in full solar spectrum into electrical energies rather than into heat. In fact, the theoretical maximum efficiency of a solar cell that has an infinite number of junctions is about 85%.

As used herein and in the appended claims, the singular forms "a," "and," and "the" include plural referents unless the context clearly dictates otherwise. Thus, for example, reference to "a substrate" includes a plurality of such substrates and reference to "the solar cell" includes reference to one or more solar cells and so forth.

Unless defined otherwise, all technical and scientific terms used herein have the same meaning as commonly understood to one of ordinary skill in the art to which this disclosure belongs. Although any methods and reagents similar or equivalent to those described herein can be used in the practice of the disclosed methods and compositions, the exemplary methods and materials are now described.

All publications mentioned herein are incorporated herein by reference in full for the purpose of describing and disclosing the methodologies, which are described in the publications, which might be used in connection with the description herein. The publications discussed above and throughout the text are provided solely for their disclosure prior to the filing date of the present application. Nothing herein is to be construed as an admission that the inventors are not entitled to antedate such disclosure by virtue of prior disclosure.

Also, the use of "or" means "and/or" unless stated otherwise. Similarly, "comprise," "comprises," "comprising" "include," "includes," and "including" are interchangeable and not intended to be limiting.

It is to be further understood that where descriptions of various embodiments use the term "comprising," those skilled in the art would understand that in some specific instances, an embodiment can be alternatively described using language "consisting essentially of" or "consisting of."

It will be understood that when an element or layer is referred to as being "on," "connected to," "coupled to," or "covering" another element or layer, it may be directly on, connected to, coupled to, or covering the other element or layer or intervening elements or layers may be present. In contrast, when an element is referred to as being "directly on," "directly connected to," or "directly coupled to" another element or layer, there are no intervening elements or layers present. Like numbers refer to like elements throughout the specification. As used herein, the term "and/or" includes any and all combinations of one or more of the associated listed items.

It will be understood that, although the terms first, second, third, etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, e.g., "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" may encompass both an orientation of above and below. The device may be otherwise oriented (rotated 90 degrees or at other orientations) and the spatially relative descriptors used herein interpreted accordingly.

Electromagnetic Radiation to Electric Energy Conversion Device (EREECD) is a device that reacts with electromagnetic (optical) radiation to produce electrical energy. Optoelectronic Energy Device (OED) refers to a device that reacts with optical radiation to produce electrical energy with an electronic device. As used herein, the term "ultraviolet range" refers to a range of wavelengths from about 5 nm to about 400 nm. As used herein, the term "visible range" refers to a range of wavelengths from about 400 nm to about 700 nm. As used herein, the term "infrared range" refers to a range of wavelengths from about 700 nm to about 2 mm. The infrared range includes the "near infrared range," which refers to a range of wavelengths from about 700 nm to about 5 µm, the "middle infrared range," which refers to a range of wavelengths from about 5 µm to about 30 µm, and the "far infrared range," which refers to a range of wavelengths from about 30 µm to about 2 mm.

A photovoltaic cell is an electrical device comprising a semiconductor that converts light or other radiant energy, in the range from ultraviolet, to infrared radiation, incident on its surface into electrical energy in the form of power/voltage/current and which has two electrodes, usually a diode with a to electrode and a bottom electrode with opposite electrical polarities. The photovoltaic cell produces direct current which flows through the electrodes. As employed herein, the term photovoltaic cell is generic to cells which convert radiant energy into electrical energy. A solar cell is a photocell that converts light including solar radiation incident on its surface into electrical energy.

A photovoltaic ("PV") cell may be connected in parallel, in series, or a combination thereof with other such cells. A common PV cell is a p-n junction device based on crystalline silicon. In various embodiments of the disclosure a PV cell comprises p-n junction devices of graphene. In other embodiments a PV cell comprises a plurality of graphene p-n junctions. Other types of PV cells can be based on a graphene p-n junction cell and other semiconductive materials, such as, but not limited to, amorphous silicon, polycrystalline silicon, germanium, organic materials, and Group III-V semiconductor materials, such as gallium arsenide (GaAs).

During operation of a photovoltaic cell, incident solar or light radiation penetrates below a surface of the PV cell and is absorbed. The depth at which the solar radiation penetrates depends upon an absorption coefficient of the cell. In the case of a PV cell based on silicon, an absorption coefficient of silicon varies with wavelength of solar radiation. At a particular depth within the PV cell, absorption of solar radiation produces charge carriers in the form of electron-hole pairs. Electrons flow through one electrode connected to the cell, while holes exit through another electrode connected to the cell. The effect is a flow of an electric current through the cell driven by incident solar radiation. Inefficiencies exist in current solar cells due to the inability to collect/use and convert the entire incident light.

Also, in accordance with a junction design of a PV cell, charge separation of electron-hole pairs is typically confined to a depletion region, which can be limited to a thickness of about 1 µm. Electron-hole pairs that are produced further than a diffusion or drift length from the depletion region typically do not charge separate and, thus, typically do not contribute to the conversion into electrical energy. The depletion region is typically positioned within the PV cell at a particular depth below a surface of the PV cell. The variation of the absorption coefficient of silicon across an incident solar spectrum can impose a compromise with respect to the depth and other characteristics of the depletion region that reduces the efficiency of the PV cell. For example, while a particular depth of the depletion region cart be desirable for solar radiation at one wavelength, the same depth can be undesirable for solar radiation at a shorter wavelength. In particular, since the shorter wavelength solar radiation can penetrate below the surface to a lesser degree, electron-hole pairs that are produced can be too far from the depletion region to contribute to an electric current.

The term "wider band-gap" refers to the difference in band-gaps between a first sub-cell (or first material) and a second sub-cell (or second material). "Band-gap" or "energy band gap" refers to the characteristic energy profile of a semiconductor that determines its electrical performance, current and voltage output, which is the difference in energy between the valence band maximum and the conduction band minimum.

N/P junction refers to a connection between a p-type semiconductor and an n-type semiconductor which produces a diode. Depletion region refers to the transition region between an n-type region and a p-type region of an N/P junction where a high electric field exists.

For thin-film solar cells, light absorption is usually proportional to the film thickness. Thin-film photovoltaics offer the potential for a significant cost reduction compared to traditional, or first generation, photovoltaics usually at the expense of high efficiency. This is achieved mainly by the use of amorphous or polycrystalline optoelectronic materials for the active region of the device, for example, amorphous-Si (a-Si). The resulting carrier collection efficiencies, operating voltages, and fill factors are typically lower than those for single-crystal cells, which reduce the overall cell efficiency. There is thus great interest in using thinner active layers combined with advanced light trapping schemes to minimize these problems and maximize efficiency.

The disclosure provides a method of fabricating graphene-based multi-junctions flexible thin-film solar cells. In contrast to the common multi-junctions flexible thin-film solar cells that use III-V semiconductor materials, the solar cells described herein use at least one, two, three or more sub-cells of a semiconducting graphene layer as a component. There are several advantages of using semiconducting graphene layers over the III-V semiconductor materials. The semiconducting graphene has a direct band gap that makes it able to absorb more photons in a much thinner region compared to the indirect band gap materials such as silicon. In addition, the electrons and holes carrier mobility of graphene is about two orders of magnitude higher than that of silicon and other III-V semiconductor materials. Since the electrical conductivity of a material is proportional to both electrons and holes carrier mobility, the internal resistance of the graphene-based solar cell will definitely be much less than that of the common III-V semiconductor-based solar cell. Unlike indium and tellurium that are available in the earth's crust in a very small quantity, carbon is abundant and the cost to fabricate graphene is comparable to the fabrication cost of silicon.

With the advantage of graphene semiconducting material, the disclosure provides a multijunction flexible solar cell. In one embodiment, the solar cell comprises multiple sub-cells, each sub-cell having a different band gap energy, wherein at least one, two, three or more sub-cell(s) comprise graphene. In one embodiment, each sub-cell below the first has a smaller band-gap (e.g., the band-gap decreases the further from the light source).

Figure 1B:
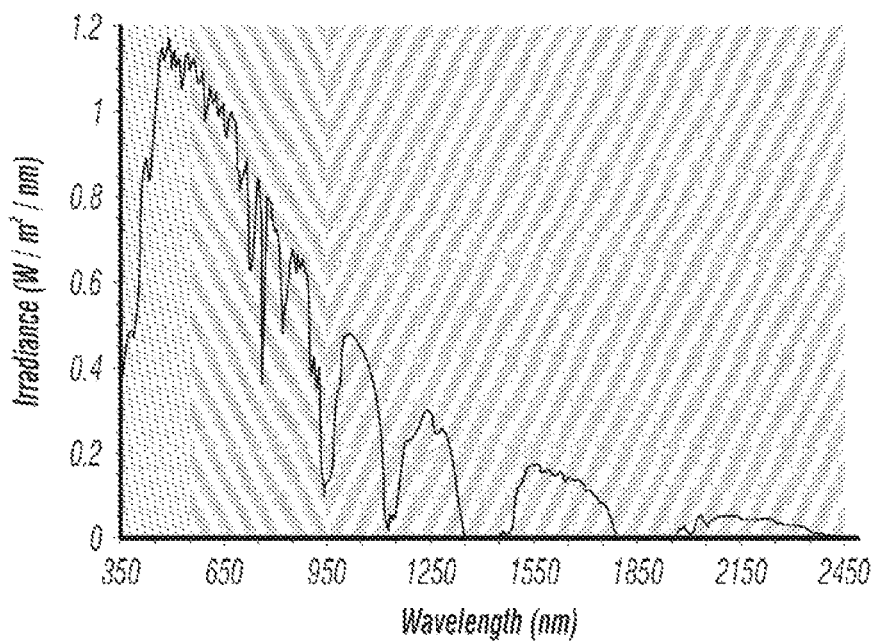

In order to absorb a large to full spectrum of sunlight while minimizing she thermalization loss, she graphene solar cell has multiple junctions. In one embodiment, the solar cell has at least three-junctions made out of Three sub-cell components of semiconducting graphene with different band gaps (FIG. 1). The top sub-cell component, for example, is made cut of semiconducting graphene with large band gap of about 2.5 eV to absorb most of the blue-green part of the solar spectrum. The middle sub-cell component is made out of semiconducting graphene with moderate band gap of about 1.5 eV to absorb most of the yellow-red-near infra-red part of the solar spectrum. The bottom sub-cell component is made out of semiconducting graphene with small band gap of about 0.5 eV to absorb the remaining part of the solar spectrum.

Referring to FIG. 1, there is shown a solar cell (1000) of the disclosure. Solar cell (1000) comprises two or more sub-cells (p-n-doped assemblies) (500a-c). Although the Figure depicts a plurality of graphene sub-cells, one of skill in the art will recognize that a single sub-cell may be graphene and one or more additional sub-cells may be a different semiconductive material. Similarly, there may be two or more sub-cells comprising graphene and one or more sub-cells comprising a different semiconductive material. In other embodiments all of the sub-cells may comprise graphene. FIG. 1 depicts each sub-cell (500) separated from the other by a conductive transparent substrate (300). Each sub-cell comprises a different band gap. The "top" (i.e., the surface closest to the incident light source) comprises a conductive metal contact and an anti-reflective coating (50). The side furthest from the light source includes a metal contact (55).

Each sub-cell (500) of semiconducting graphene consists or two equal band gap monoatomic graphene layers, where one layer is n-type doped (e.g., with nitrogen, phosphorous, oxygen, or fluorine), and the other one is p-type doped (e.g., with hydrogen, boron, or aluminum). In order to increase the incident photons absorption and to reduce the thermalization loss even further, each sub-cell component of semiconducting graphene may consist or more than two monoatomic graphene layers (see, e.g., FIG. 2).

Figure 2:
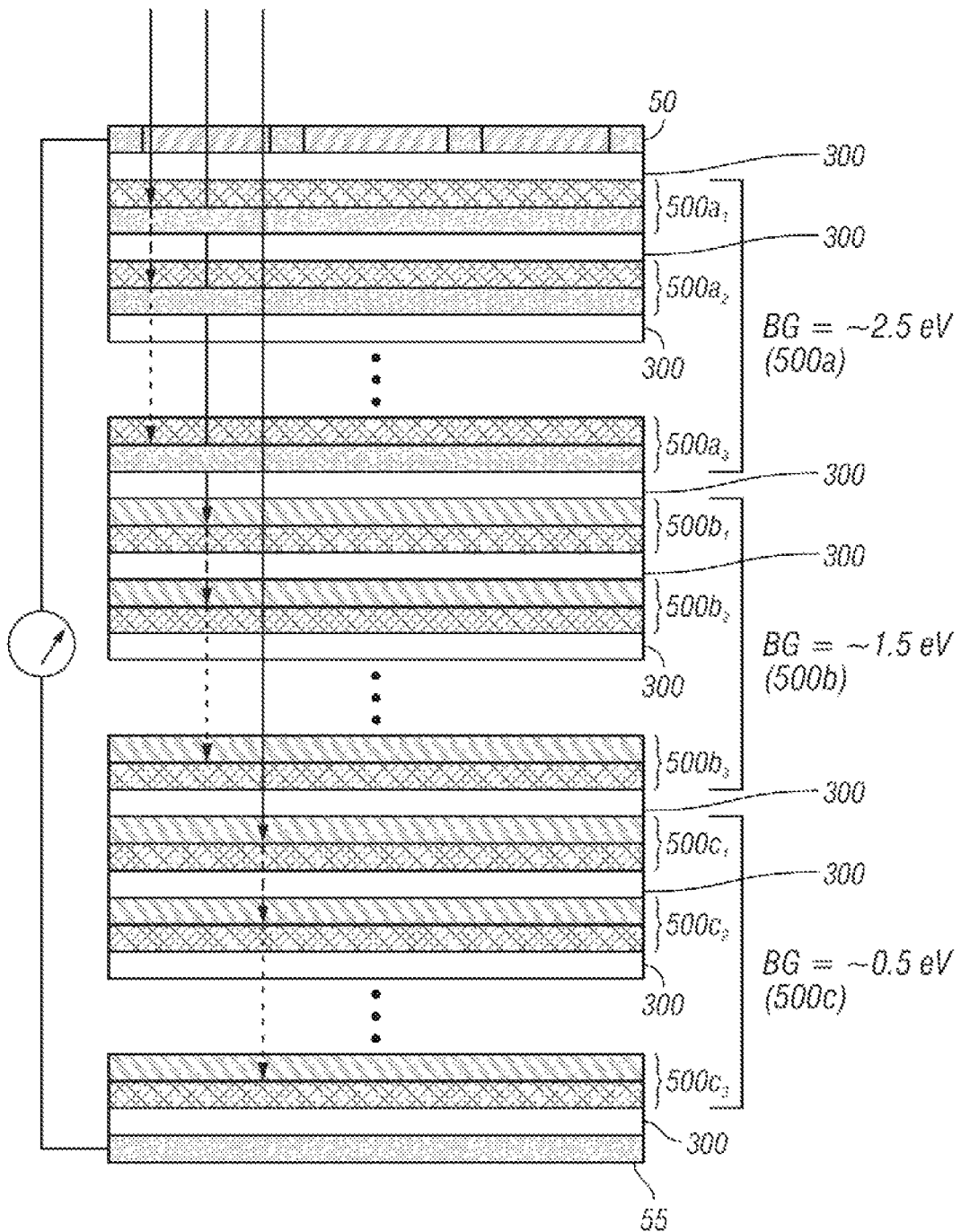
FIG. 2 shows a triple-junctions graphene solar cell made out of three components of semiconducting graphene. Each component has multiple equal band gap monoatomic layers of graphene to increase the incident photons absorption.

FIG. 2 shows a multi-junction solar cell comprising multiple graphene sub-cells each with similar or identical band-gaps, decreasing from top (i.e., closest to incident light source) to bottom (furthest from the incident light source).

FIG. 2 shows a plurality of n- and p-doped monoatomic graphene layers. Depicted in FIG. 2 are a plurality of graphene sub-cells (500*a-c*), each sub-cell further comprising multiple monoatomic graphene layers 500$a_{1-3}$, 500$b_{1-3}$ and 500$c_{1-3}$. Each sub-cell is spaced from the next adjacent sub-cell by a conductive transparent substrate (300). At the top of the solar cell a metal contact and anti-reflective coating (50) are depicted. At the bottom of the solar cell a metal contact (55). The arrows in the figure represent light energy (hv) of a particular wavelength being absorbed at materials of an absorptive band-gap. In FIG. 2, each of 500$a_{1-3}$ are of a similar or identical band-gap; each of 500$b_{1-3}$ are of similar or identical band-gap, however, a smaller band-gap than 500$a_{1-3}$; and 500$c_{1-3}$ are of similar or identical band-gap, however, a smaller band-gap than 500$a_{1-3}$ and 500$b_{1-3}$.

Figure 3:
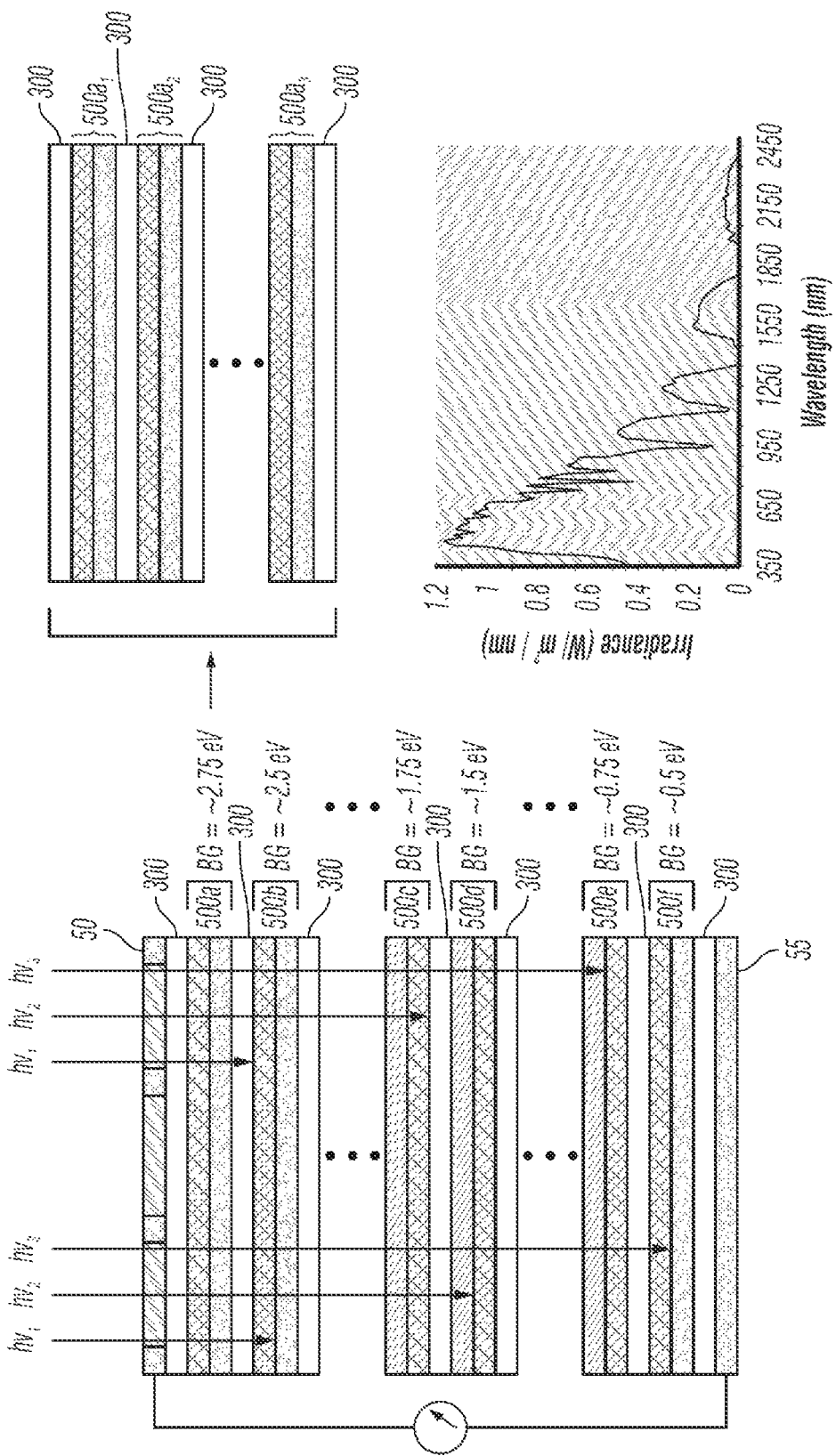
FIG. 3 shows a ten-junction graphene solar cell made out of ten components of semiconducting graphene. Each component has multiple equal band gap monoatomic layers of graphene to increase the incident photons absorption.

Thus, to increase the energy conversion efficiency, more sub-cells with similar or different band gaps can be added such that it has more than 1, 2, 3, 4, 5, 6, 7, 8, 9, 10 or more junctions. As mentioned earlier, a solar cell that has more junctions will have energy conversion efficiency closer so the maximum thermodynamic efficiency of 85%. Therefore, a multi-junction solar cell that has about ten sub-cells with band gap increments of about ~0.25 eV, is an effective design (see, e.g., FIG. 3). As mentioned earlier, each component may consist of multiple monoatomic graphene layers to increase the absorption of the incident photons. FIG. 3 depicts an example of a multi-sub-cell solar cell.

FIG. 3 shows a multi-junction solar cell comprising multiple graphene sub-cells. Groups of sub-cells (e.g., 500*a* or 500*b* . . . 500*x*) each have different band-gaps, decreasing from top (i.e., closest to incident light source) to bottom (furthest from the incident light source). Within each group a plurality of monoatomic graphene layers are depicted, each having similar or identical band-gaps (e.g., 500$a_{1-3}$) FIG. 3 shows a plurality of n- and p-doped monoatomic graphene layers a combination of which define a sub-cell (500). Depicted in FIG. 3 are a plurality of graphene sub-cells (500*a-f*), each sub-cell further comprising 500$a_{1-3}$ (shown). 500$b_{1-3}$ (not shown) and 500$c_{1-3}$ (not shown). Each sub-cell is spaced from the next adjacent sub-cell by a conductive transparent substrate (300). At the top of the solar cell a metal contact and anti-reflective coating (50) are depicted. At the bottom of the solar cell a metal contact (55). The arrows in the figure represent light energy (hv) of a particular wavelength being absorbed at materials of an absorptive band-gap.

In other embodiments, the solar cell of the disclosure can comprise one or more (e.g., three or more) sub-cells of graphene semiconductive material and one or more sub-cells of a non-graphene semiconductive material.

However, there is a drawback corresponding with the increased number of junctions—it increases the overall thickness of the solar cell. A thick solar cell, despite its efficiency, will have less appeal to a thin one mainly because of its lack of flexibility. However, an advantage of the invention provided herein is that the thickness of multi-junction solar cells is minimized due to the thin material graphene.

The term "semiconductor" or "semiconductive material" is generally used to refer to elements, structures, or devices, etc. comprising materials that have semiconductive properties, unless otherwise indicated. The term "non-graphene semiconductor" or "non-graphene semiconductive material" is generally used to refer to materials including, but are not limited to: elements from Group IV of the periodic table; materials including elements from Group IV of the period table; materials including elements from Group III and Group V of the periodic table; materials including elements from Group II and Group VI of the periodic table; materials including elements from Group I and Group VII of the periodic table; materials including elements from Group IV and Group VI of the periodic table; materials including elements from Group V and Group VI of the periodic table; and materials including elements from Group II and Group V of the periodic table. Other materials with semiconductive properties may include: layered semiconductors; metallic alloys; miscellaneous oxides; some organic materials, and some magnetic materials, semiconductor structure may comprise either doped or undoped material.

A graphene layer can be fabricated by CVD (chemical vapor deposition) technique on a thin film of metal (e.g., nickel or copper). During this fabrication process, the graphene layer can be doped by introducing dopant-containing gas along with, for example, the carbon-containing gas and other precursor gasses to the reactor. After being fabricated, the graphene layer can be transferred from its metal substrate to a transparent conductive substrate using a transfer tape or other polymeric sacrificial layers. The band gap opening of the graphene layer can be created by exposing it to dry oxidation or reduction treatment. In one embodiment, the conductive substrate is a flexible conductive substrate.

For example, graphene samples can be grown by chemical vapor deposition technique on nickel coated $SiO_2$/Si substrates at 900° C. under a flow of 25 scam methane and 1500 sccm hydrogen precursor gases. These as-grown samples are then exposed to vacuum-pyrolysis treatment at an elevated temperature of 250° C. and a mild vacuum at 2.5 torr for 24 hours to remove the residual contaminants adsorbed during the growth process.

Oxygen dopants can be introduced to the graphene samples by two different oxidation processes. The first method comprises oxidizing by UV/ozone treatment (Bioforce Nanosciences) at standard room temperature and pressure for 5 minutes, 30 minutes and 120 minutes. The second method comprises oxidizing by remote oxygen plasma (Tepla M4L) under 20 Watts of RF power at a constant oxygen flow rate of 20 SCCM and chamber pressure of 500 mTorr for 5 seconds, 10 second, 30 seconds and 60 seconds.

The oxidation methods described above also introduce an energy gap opening in graphene. The opening of the gap itself can be correlated to the surface concentration of oxygen dopants, where the energy gap increases strongly as the increase of oxygen dopants concentration. For example, an increase of oxygen-to-carbon atomic ratio from ~9% to ~21% is enough to increase the energy gap opening from 0 eV to ~2.4 eV. Note that a significantly observable energy gap opening occurs when the oxygen dopants concentration is higher than the oxygen-to-carbon atomic ratio threshold of ~15%. In general, the oxygen plasma treatment gives a much faster rate of oxidation than the UV/ozone treatment. On the other hand, the slower oxidation rate of UV/ozone treatment may provide a better control over the degree energy can opening.

Hydrogen dopants can be introduced to the graphene samples by treating them in hot hydrogen gas. This method comprises flowing hydrogen gas at an elevated temperature of 600° C. at a pressure of 1 atm for 5 minutes, 10 minutes, and 15 minutes.

The reduction method described above also introduces an energy gap opening in graphene. The opening of the gap itself can be correlated to the reduction time, where the energy gap increases as the increase of exposure time. For example, an increase of the energy gap opening from 0 eV to ~0.6 eV can be achieved by reducing the graphene samples for 15 minutes.

As mentioned before, a p-type doped or n-type doped monoatomic graphene layer (200) can be fabricated by, for example, CVD technique on a thin film of metal (100) (FIG.

Figure 4A:
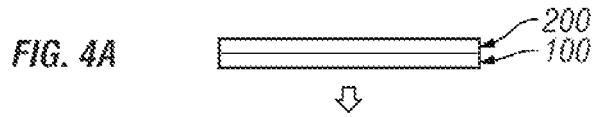
FIG. 4A-G shows a process flow diagram for producing a graphene-based multi-junctions flexible solar cell.
Figure 4B:
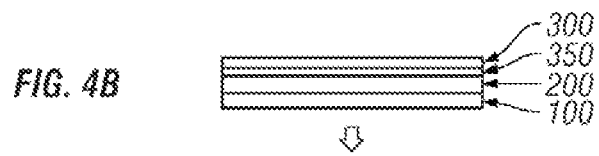
Figure 4C:
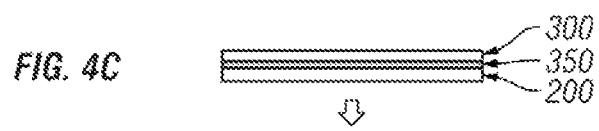
Figure 4D:
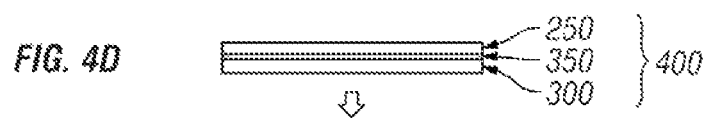
Figure 4E:
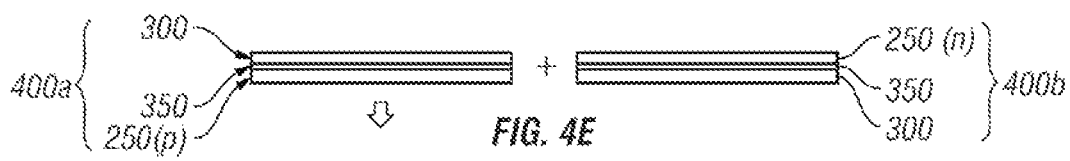
Figure 4F:
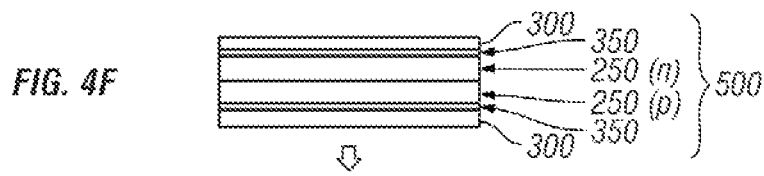
Figure 4G:
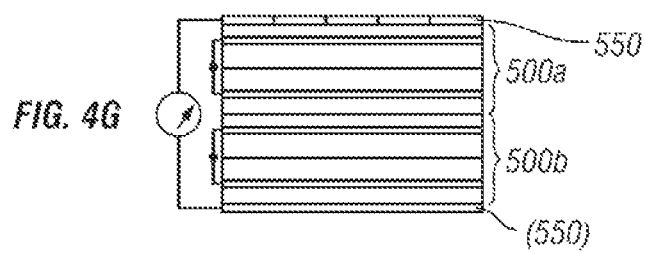

4A). A transparent conductive flexible substrate (300) can then be placed onto the surface of the monoatomic graphene layer (200) (FIG. 4B). Since most of conductive polymer substrates that are suitable for this application are translucent, any type of transparent flexible substrates can be used. If a transparent flexible substrate is used, a thin film of transparent conductive oxide (350), such as indium tin oxide or aluminum zinc oxide, is predeposited on the surface of the substrate that is in contact with the monoatomic graphene layer (200). Subsequently the metal film (100) is removed from the graphene layer (200) by wet or dry etching process (FIG. 4C). The graphene layer (200) is then oxidized to open up its band gap (250) to provide a graphene-flexible substrate assembly (400) (FIG. 4D). The assembly (400) can then be combined with one or more other assemblies (400a-c) that has equal band gap but opposite doping (250n-type and 250p-type) (FIG. 4E-F) to provide a p-n-doped graphene assembly (500). The p-n-doped assembly or sub-cell (500) can then be stacked on top or on bottom of other sets of assembly with different band gaps (500a and 500b...) (FIG. 4G). The set of assembly with the largest band gap is placed on top (e.g., proximal to a light source) and similarly the set of assembly with the smallest band gap is placed on bottom (distal to the light source). Metal contact (550) and wiring are employed to establish electrical connection between one set of assembly (e.g., 400a) with the another assembly (e.g., 400b) (FIG. 4G) and between the whole set of solar cell with the external load.

As discussed herein, embodiments of the disclosure may be used in photocell applications. As such, the semiconductor structures typically comprise semiconductor material having properties for effective solar energy absorption and conversion of that energy to electricity. Such material comprise graphene and may comprise in additional sub-cells crystalline silicon, either monocrystalline silicon or polycrystalline silicon, and doped or undoped. The non-graphene semiconductor material may also be amorphous silicon, micromorphous silicon, protocrystalline silicon or nanocrystalline silicon. The semiconductor material may also be cadmium telluride; copper-indium selenide, copper indium gallium selenide gallium arsenide, gallium arsenide phosphide, cadmium selenide, indium phosphide, or a-Si:H alloy or combinations of other elements from groups I, III and VI in the periodic table as well as transition metals; or other inorganic elements or combinations of elements known in the art for having desirable solar energy conversion properties.

Methods of orientation of materials in photovoltaic cells and the order of reflective, nonreflective, conductive electrodes are known.

A number of embodiments of the invention have been described. Nevertheless, it will be understood that various modifications may be made without departing from she spirit and scope of the invention. Accordingly, other embodiments are within the scope of the following claims.

What is claimed is:

1. A multijunction solar cell comprising:
    a plurality of sub-cells, at least two sub-cells of the plurality of sub-cells having a different band gap energy, wherein at least one of the plurality of sub-cells comprises a first monoatomic graphene layer stacked with a second monoatomic graphene layer,
    and wherein the at least one of the plurality of sub-cells also comprises an n-type dopant distributed with the entire first monoatomic graphene layer and a p-type dopant distributed with the entire second monoatomic graphene layer.

2. The multijunction solar cell of claim 1, wherein the plurality of sub-cells comprise more than two sub-cells.

3. The multijunction solar cell of claim 2, wherein the plurality of sub-cells comprises three or more sub-cells.

4. The multijunction solar cell of claim 1, wherein the different band gap energy decreases in subsequent sub-cells more distal from incident electromagnetic radiation.

5. The multijunction solar cell of claim 1, wherein the solar cell comprises a plurality of sub-cells each having a band-gap difference of about 0.25 eV or more compared to an immediately adjacent sub-cell.

6. The multijunction solar cell of claim 1, wherein the solar cell comprises a plurality of sets of sub-cells, each set comprising a plurality of sub-cells and each sub-cell within a set comprising similar band gaps and each different set comprising different band gaps.

7. The multijunction solar cell of claim 1, further comprising a transparent or translucent conductive substrate separating and in contact with each sub-cell.

8. The multijunction solar cell of claim 7, further comprising an anti-reflective coating and metal contact at the surface closest to the light source and a metal contact at the surface furthest from the light source, the contacts separated by the plurality of sub-cells.

9. The multijunction solar cell of claim 1, wherein the n-type dopant is nitrogen or phosphorous.

10. The multijunction solar cell of claim 1, wherein the p-type dopant is boron or aluminum.

11. A multijunction solar cell of claim 1,
    wherein the at least one of the plurality of sub-cells is a first sub-cell, the solar cell comprising:
    a top metal contact and an antireflective coating;
    the first sub-cell comprising:
        a first transparent or translucent conductive layer in contact with the top metal contact;
        the first monoatomic graphene layer;
        the second monoatomic graphene layer, wherein both the first and second graphene layers have the same band gap;
    a second sub-cell beneath the first sub-cell, the second sub-cell comprising:
        a second transparent or translucent conductive layer;
        a third monoatomic graphene layer;
        a fourth monoatomic graphene layer stacked with the third monoatomic graphene layer,
        wherein both the third and fourth monoatomic graphene layers have the same band gap and wherein the band gap of the third and fourth monoatomic graphene layers is the same or smaller than the band gap of the first sub-cell; and
    a bottom metal contact.

12. The multijunction solar cell of claim 11, wherein one or more additional sub-cells separate the first and second sub-cells.

13. The multijunction solar cell of claim 1, wherein the at least one of the plurality of sub-cells comprises a third monoatomic graphene layer stacked with the first and second monoatomic graphene layers.

14. A multijunction solar cell, comprising:
    a first sub-cell comprising:
        a first monoatomic graphene layer;
        a second monoatomic graphene layer in contact with the first monoatomic graphene layer;
        a first n-type dopant distributed with the entire first monoatomic graphene layer; and
        a first p-type dopant distributed with the entire second monoatomic graphene layer, wherein both the first and the second monoatomic graphene layers have the same first band gap;

a first transparent or translucent layer in contact with either the first monoatomic graphene layer or the second monoatomic graphene layer; and a second sub-cell beneath the first transparent or translucent layer, the second sub-cell comprising:
   a third monoatomic graphene layer;
   a fourth monoatomic graphene layer in contact with the third monoatomic graphene layer,
   a second n-type dopant distributed with the entire third monoatomic graphene layer; and
   a second p-type dopant distributed with the entire fourth monoatomic graphene layer, wherein both the third and the fourth monoatomic graphene layers have the same second band gap, the second band gap being smaller than the first band gap.

15. The multijunction solar cell of claim 14, comprising:
a second transparent or translucent layer in contact with either the third monoatomic graphene layer or the fourth monoatomic graphene layer; and a third sub-cell beneath the second transparent or translucent layer, the third sub-cell comprising:
   a fifth monoatomic graphene layer;
   a sixth monoatomic graphene layer in contact with the fifth monoatomic graphene layer,
   a third n-type dopant distributed with the entire fifth monoatomic graphene layer; and
   a third p-type dopant distributed with the entire sixth monoatomic graphene layer, wherein both the fifth and the sixth monoatomic graphene layers have the same third band gap, the third band gap being smaller than the second band gap.

16. The multijunction solar cell of claim 14, wherein the first and the second monoatomic graphene layers are the only monoatomic graphene layers in the first sub-cell.

* * * * *